(12) United States Patent
Sul et al.

(10) Patent No.: US 7,432,781 B2
(45) Date of Patent: Oct. 7, 2008

(54) MONOLITHIC DUPLEXER AND FABRICATION METHOD THEREOF

(75) Inventors: Sang-chul Sul, Suwon-si (KR); Duck-hwan Kim, Goyang-si (KR); Chul-soo Kim, Hwaseong-si (KR); In-sang Song, Seoul (KR); Moon-chul Lee, Yongin-si (KR); Kyu-dong Jung, Suwon-si (KR); Jea-shik Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 163 days.

(21) Appl. No.: 11/392,624

(22) Filed: Mar. 30, 2006

(65) Prior Publication Data
US 2007/0024391 A1    Feb. 1, 2007

(30) Foreign Application Priority Data
Aug. 1, 2005    (KR) ...................... 10-2005-0070303

(51) Int. Cl.
*H03H 7/46* (2006.01)
(52) U.S. Cl. .......................... 333/132; 333/12; 333/135; 333/248

(58) Field of Classification Search .................. 333/12, 333/132, 135, 247, 248, 250
See application file for complete search history.

(56) References Cited

U.S. PATENT DOCUMENTS

| 7,230,512 B1 * | 6/2007 | Carpenter et al. ........... 333/193 |
| 7,236,070 B2 * | 6/2007 | Ajioka et al. ............... 333/247 |
| 2005/0264375 A1 * | 12/2005 | Ikuta et al. .................. 333/133 |

* cited by examiner

*Primary Examiner*—Robert J. Pascal
*Assistant Examiner*—Kimberly E Glenn
(74) *Attorney, Agent, or Firm*—Sughrue Mion, PLLC

(57) ABSTRACT

A monolithic duplexer and a fabrication method thereof. The monolithic duplexer includes a device wafer, a plurality of elements distanced from each other on a top portion of a device wafer, first sealing parts formed on the top portion of the device wafer, and a plurality of first ground planes formed between the plurality of elements. A cap wafer is also provided having an etched area for packaging the device wafer, a plurality of protrusion parts, a plurality of ground posts, and cavities. Second sealing parts are formed on a bottom portion of the protrusion parts, and a plurality of second ground planes cover the plurality of ground posts. Via holes vertically penetrate the cap wafer to connect to the plurality of the second ground planes, and ground terminals are formed on top portions of the via holes. The first sealing parts and the first ground planes are attached to the second sealing parts and the second ground planes, respectively.

20 Claims, 2 Drawing Sheets

MONOLITHIC DUPLEXER AND FABRICATION METHOD THEREOF

CROSS-REFERENCE TO RELATED APPLICATIONS

This application claims priority from Korean Patent Application No. 10-2005-0070303, filed on Aug. 1, 2005, the entire content of which are incorporated herein by reference.

BACKGROUND OF THE INVENTION

1. Field of the Invention

Apparatuses and methods consistent with the present invention relate to a duplexer and a fabrication method, and more particularly to a monolithic duplexer that can obtain a high isolation between elements integrated on a single chip and fabrication method thereof.

2. Description of the Related Art

A duplexer properly splits signals transmitted and received through a single antenna in a communication system using a frequency division system such that one antenna can effectively be shared.

The duplexer basically comprises a transmitter filter and a receiver filter. The transmitter filter is a band pass filter which passes only a signal in a frequency band for transmission, and the receiver filter is a band pass filter which passes only a signal in a frequency band for reception. Signals only in a certain frequency band can pass the filters so that one antenna can be effectively shared. The duplexer is mainly applied to various radio frequency (RF) devices performing wireless communication.

Since a difference between the frequencies of the signals transmitted and received through the transmitter filter and the receiver filter is small, the signals are quite sensitive to inter-signal interference. Accordingly, the duplexer can have improved performance by adding an isolation part which can prevent the inter-signal interference by isolating the transmitter filter and the receiver filter from each other. The isolation part implements a phase shifter using a capacitor and an inductor to prevent the inter-signal interference by making the phase difference between the frequencies of the transmitted signal and the received signal substantially at 90 degrees.

As the use of mobile communication devices, such as mobile phones, increases, the demand for miniaturized and lightweight duplexers for the devices has increased. Additionally, the demand for miniaturized and lightweight filters performing as the transmitter filter and receiver filter, which are component parts of the duplexer, has increased. A film bulk acoustic resonator (FBAR) is known as a means for a filter which is miniaturized, lightweight and suitable for electric force. The FBAR can be mass-produced at a minimum cost and can be implemented in a minimum size.

The duplexer is required to be miniaturized and lightweight due to the miniaturization of mobile phones; however, it is difficult to obtain high isolation as the duplexer becomes miniaturized. Accordingly, a micro duplexer is required which is miniaturized, lightweight, and capable of obtaining a high isolation.

SUMMARY OF THE INVENTION

An aspect of the present invention is to provide a monolithic duplexer with a plurality of elements integrated thereon, which prevents interference between the integrated elements so that a high isolation can be obtained, and a fabrication method thereof.

In an exemplary embodiment of the present invention, there is provided a monolithic duplexer comprising, a device wafer, a plurality of elements distanced from each other in a certain area on a top portion of a device wafer, first sealing parts formed on opposite sides of the top portion of the device wafer, a plurality of first ground planes formed between the plurality of elements, a cap wafer, a certain area of which is partially etched for packaging the device wafer to form a plurality of protrusion parts, a plurality of ground posts, and cavities, second sealing parts formed on a bottom portion of the protrusion parts, a plurality of second ground planes formed to cover the plurality of ground posts, via holes vertically penetrating the cap wafer to connect to a certain area of the plurality of the second ground planes, and ground terminals formed on top portions of the via holes. The first sealing parts and the first ground planes on the device wafer are welded to the second sealing parts and the second ground planes, by a method of the metal/metal bonding, for example.

The plurality of ground posts may be formed between the protrusion parts on opposite sides of the surface of the cap wafer, and the cavities may be formed between the protrusion parts and the ground posts, and between the plurality of ground posts.

The plurality of elements may be radio frequency (RF) passive elements.

The first sealing parts and the first ground planes may be made of a metal material.

The first ground planes may prevent an electromagnetic interference between the plurality of elements.

The plurality of the ground posts may be formed to be opposed to the plurality of the first ground planes to prevent interference between the plurality of elements.

The via holes may be interconnect structures to electrically connect the ground posts with the ground terminals.

The plurality of the second ground planes may be formed to be distanced from each other.

The plurality of the second ground planes may be formed to electrically connect to each other.

The device wafer and the cap wafer may be deposited according to a metal/metal bonding.

In accordance with another exemplary embodiment of the present invention, there is provided a fabrication method of a monolithic duplexer comprising, forming a plurality of elements distanced from each other in a certain area on a top portion of a device wafer, forming first sealing parts on opposite sides of the top portion of the device wafer and forming a plurality of first ground planes between the plurality of elements, partially etching a certain area of a surface of a cap wafer for packaging the device wafer to form protrusion parts on opposite sides of the surface of the cap wafer, a plurality of ground posts between the protrusion parts, and cavities between the protrusion parts and the ground posts, and between the plurality of ground posts, forming second sealing parts on a bottom portion of the protrusion parts and forming a plurality of second ground planes to cover the plurality of ground posts, forming via holes vertically penetrating the cap wafer to connect to a certain area of the plurality of the second ground planes and forming ground terminals on top portions of the via holes, and depositing the cap wafer on the device wafer.

The plurality of elements may be radio frequency (RF) passive elements.

The first sealing parts and the first ground planes may be made of a metal material.

The first ground planes may prevent an interference between the plurality of elements.

The plurality of the ground posts may be formed to be opposed to the plurality of the first ground planes to prevent the interference between the plurality of elements.

The via holes may be interconnect structures to electrically connect the ground posts with the ground terminals.

The plurality of the second ground planes may be formed to be distanced from each other.

The plurality of the second ground planes may be formed to electrically connect to each other.

The device wafer and the cap wafer may be deposited according to a metal/metal depositing.

BRIEF DESCRIPTION OF THE DRAWINGS

The above aspects of the present invention will be more apparent by describing certain exemplary embodiments of the present invention with reference to the accompanying drawings, in which.

DETAILED DESCRIPTION OF THE EXEMPLARY EMBODIMENTS

Figure 1A:
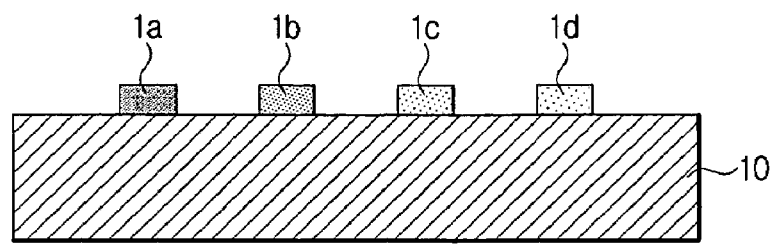
FIGS. 1A through 1F are cross-sectional views for explaining a monolithic duplexer and fabrication method thereof according to an exemplary embodiment of the present invention.

Exemplary embodiments of the present invention will be described in detail with reference to FIGS. 1A-1F. In the drawings, the same elements are denoted by the same reference numerals throughout the drawings. In the following description, detailed descriptions of known functions and configurations incorporated herein have been omitted for conciseness and clarity.

FIGS. 1A through 1F are cross-sectional views for explaining a monolithic duplexer and fabrication method of the monolithic duplexer according to an exemplary embodiment of the present invention Referring to FIG. 1A, a plurality of elements 1a through 1d are integrated on a certain area of a device wafer 10. The device wafer 10 may be made of a silicon substrate. The plurality of elements 1a through 1d are distanced from each other on the device wafer 10.

In the present exemplary embodiment, the first through the fourth elements 1a through 1d are integrated on the device wafer 10. However, this should not be considered as limiting. More elements may be integrated on the device wafer 10.

In the present embodiment, the first element 1a and the fourth element 1d may be generally RF passive elements, and more particularly, the first element 1a may be an inductor, the second element 1b may be a transmitter filter, and the third element 1c may be a receiver filter.

The transmitter filter 1b and the receiver filter 1c are band pass filters which pass only signals in a certain frequency band as described above. In order to adjust the frequency band, a plurality of film bulk acoustic resonators (FBARs) may be connected in series or parallel to be used as a filter.

Figure 1B:
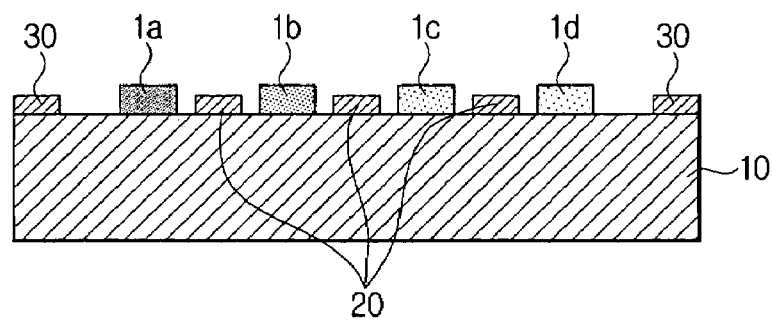

As shown in FIG. 1B, first sealing parts 30 are formed on opposite sides of a top portion of the device wafer 10, and first ground planes 20 are formed between the first element 1a and the second element 1b, between the second element 1b and the third element 1c, and between the third element 1c and the fourth element 1d on the top portion of the device wafer 10.

The first ground planes 20 are formed between the plurality of elements 1a through 1d to prevent the electromagnetic interference between elements 1a through 1d. The first sealing parts 30 and the first ground planes 20 on the device wafer 10 are made of metal material such as gold (Au).

Figure 1C:
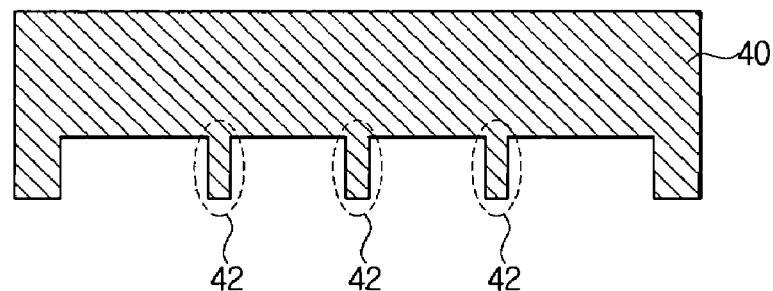

As shown in FIG. 1C, a certain area of a cap wafer 40, for packaging the device wafer 10, is partially etched to form cavities, and a plurality of protrusion parts, i.e. a plurality of ground posts 42. The cap wafer 40 may be partially removed by either dry-etching or wet-etching.

The ground posts 42 are formed to be opposed to the first ground planes 20 of FIG. 1B, and prevent the interference between elements 1a through 1d as the first ground planes 20.

Figure 1D:
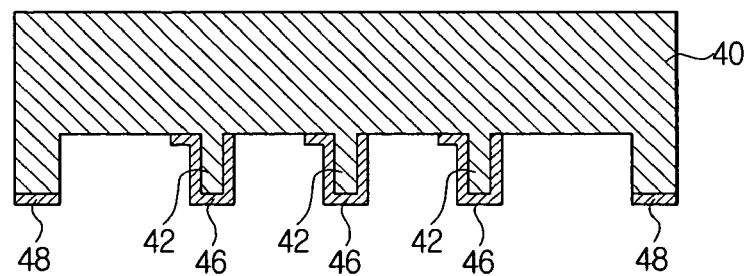

As shown in FIG. 1D, second sealing parts 48 are formed on a bottom surface of the protrusion part formed by etching on the opposite sides of the cap wafer 40, and second ground planes 46 are formed to cover the plurality of ground posts 42. In FIG. 1D, the plurality of the second ground planes 46 are distanced from each other; however, the plurality of the second ground planes 46 may be formed to electrically connect to each other.

Figure 1E:
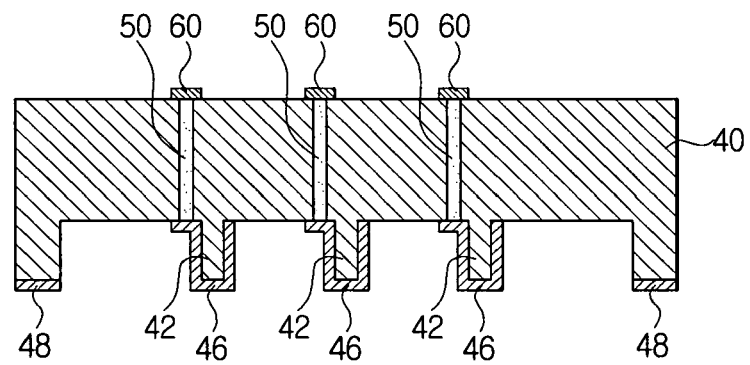

As shown in FIG. 1E, a plurality of via holes 50, which are interconnect structures, are formed to electrically connect the plurality of ground posts 46 with an external ground. Ground terminals 60 are formed on top portions of the via holes 50.

Figure 1F:
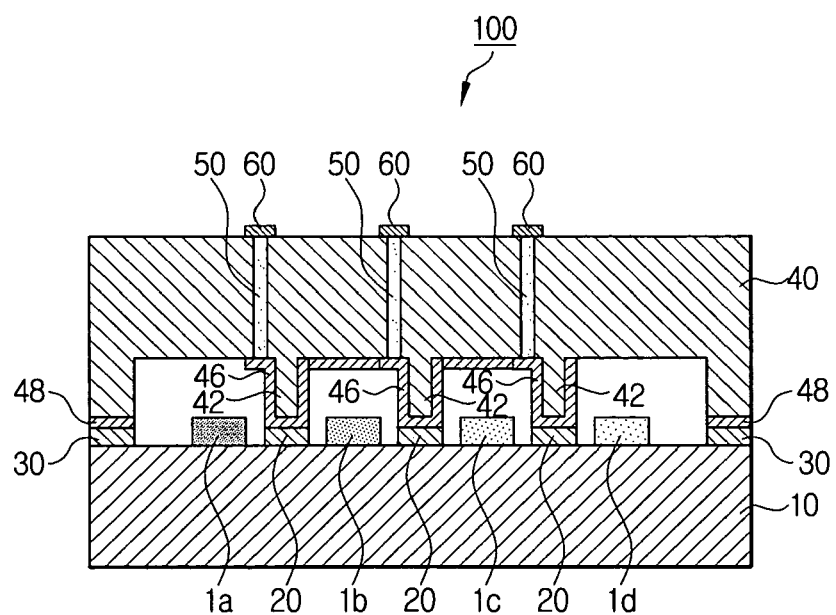

As shown in FIG. 1F, the device wafer 10 and the cap wafer 40 are bonded by a cold weld or fusion weld method to fabricate a monolithic duplexer 100.

As described above, according to an exemplary embodiment of the present invention, electromagnetic interference between elements integrated on the monolithic duplexer can be prevented such that a high isolation can be obtained.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A fabrication method of a monolithic duplexer, the method comprising:
    forming a plurality of elements spaced from each other on a top portion of a device wafer;
    forming first sealing parts on opposite ends of the top portion of the device wafer and forming a plurality of first ground planes between the plurality of elements;
    partially etching a surface of a cap wafer, which packages the device wafer, to form protrusions on opposite ends of the cap wafer, and to form a plurality of ground posts between the protrusions such that cavities are formed between the protrusions and the ground posts;
    forming second sealing parts on bottom portions of the protrusions and forming a plurality of second ground planes which cover the plurality of ground posts;
    forming via holes penetrating the cap wafer to connect to the plurality of second ground planes and forming ground terminals on top portions of the via holes; and
    bonding the device wafer and the cap wafer to form each of the ground posts between each of the plurality of elements.

2. The method as claimed in claim 1, wherein the plurality of elements are radio frequency (RF) passive elements.

3. The method as claimed in claim 1, wherein the first sealing parts and the first ground planes are made of a metal material.

4. The method as claimed in claim 1, wherein the first ground planes prevent an electromagnetic interference between the plurality of elements.

5. The method as claimed in claim 1, wherein the plurality of ground posts are formed to be opposed to the plurality of first ground planes to prevent interference between the plurality of elements.

6. The method as claimed in claim 1, wherein the via holes are interconnect structures to electrically connect the ground posts with the ground terminals.

7. The method as claimed in claim 1, wherein the plurality of second ground planes are formed to be spaced from each other.

8. The method as claimed in claim 1, wherein the plurality of second ground planes are formed to electrically connect to each other.

9. The method as claimed in claim 1, wherein the device wafer and the cap wafer are bonded by one of a cold weld and a fusion weld.

10. A monolithic duplexer comprising:
a device wafer;
a plurality of elements spaced from each other on a top portion of the device wafer;
first sealing parts disposed on opposite ends of the top portion of the device wafer;
a plurality of first ground planes disposed between the plurality of elements;
a cap wafer having a plurality of protrusions and ground posts, which form cavities;
second sealing parts formed on bottom portions of the protrusions;
a plurality of second ground planes covering the plurality of ground posts;
via holes which penetrate the cap wafer to connect to the plurality of second ground planes; and
ground terminals disposed on top portions of the via holes,
wherein the device wafer and the cap wafer are bonded to each other as the first sealing parts and the second sealing parts are welded to each other, the plurality of ground posts are formed thereby between the plurality of elements, and the first ground planes contact the second ground planes.

11. The monolithic duplexer as claimed in claim 10, wherein the plurality of ground posts are formed between the protrusions, and the protrusions are on opposite ends of the surface of the cap wafer, and
the cavities are formed between the protrusions and the ground posts, and between the plurality of ground posts.

12. The monolithic duplexer as claimed in claim 10, wherein the plurality of elements are radio frequency (RF) passive elements.

13. The monolithic duplexer as claimed in claim 10, wherein the first sealing parts and the first ground planes are made of a metal material.

14. The monolithic duplexer as claimed in claim 10, wherein the first ground planes prevent an electromagnetic interference between the plurality of elements.

15. The monolithic duplexer as claimed in claim 10, wherein the plurality of ground posts are disposed to be opposed to the plurality of first ground planes to prevent interference between the plurality of elements.

16. The monolithic duplexer as claimed in claim 10, wherein the via holes electrically connect the ground posts with the ground terminals.

17. The monolithic duplexer as claimed in claim 10, wherein the plurality of second ground planes are disposed to be spaced from each other.

18. The monolithic duplexer as claimed in claim 10, wherein the plurality of second ground planes are disposed to electrically connect to each other.

19. The monolithic duplexer as claimed in claim 10, wherein the device wafer and the cap wafer are bonded with metal to metal bonding.

20. The method as claimed in claim 1, wherein the cavities are formed between the ground posts, and between the protrusions and the ground posts.

* * * * *